United States Patent
McCusker et al.

(10) Patent No.: US 11,639,957 B2
(45) Date of Patent: May 2, 2023

(54) PLANAR RING RADIATION BARRIER FOR CRYOGENIC WAFER TEST SYSTEM

(71) Applicants: Kelsey McCusker, Sparrows Point, MD (US); Stanley Katsuyoshi Wakamiya, Ellicott City, MD (US); Jonathan Shane Atienza, Satellite Beach, FL (US); Jonathan Francis Van Dyke, East Elmhurst, NY (US); Kevin Collao, Rosedale, MD (US)

(72) Inventors: Kelsey McCusker, Sparrows Point, MD (US); Stanley Katsuyoshi Wakamiya, Ellicott City, MD (US); Jonathan Shane Atienza, Satellite Beach, FL (US); Jonathan Francis Van Dyke, East Elmhurst, NY (US); Kevin Collao, Rosedale, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 60 days.

(21) Appl. No.: 17/366,337

(22) Filed: Jul. 2, 2021

(65) Prior Publication Data
US 2023/0003791 A1    Jan. 5, 2023

(51) Int. Cl.
*G01R 31/28* (2006.01)
(52) U.S. Cl.
CPC ..... *G01R 31/2877* (2013.01); *G01R 31/2862* (2013.01); *G01R 31/2867* (2013.01)

(58) Field of Classification Search
CPC .......... H01L 21/6831; H01L 21/67248; H01L 21/6833; H01L 21/67742; H01L 21/67173;
(Continued)

(56) References Cited

U.S. PATENT DOCUMENTS 5,144,810 A * 9/1992 Nagao .................. F04B 37/08
                                                         165/4
5,777,485 A * 7/1998 Tanaka .............. G01R 31/2887
                                                       324/750.16
(Continued)

FOREIGN PATENT DOCUMENTS

WO    WO20211102118 A2 *  5/2021

*Primary Examiner* — Vinh P Nguyen
(74) *Attorney, Agent, or Firm* — Tarolli, Sundheim, Covell & Tummino LLP

(57) ABSTRACT

One example includes a cryogenic wafer test system. The system includes a first chamber that is cooled to a cryogenic temperature and a wafer chuck confined within the first chamber. The wafer chuck can be configured to accommodate a wafer device-under-test (DUT) comprising a plurality of superconducting die. The system also includes a second chamber that is held at a non-cryogenic temperature and which comprises a wafer chuck actuator system configured to provide at least one of translational and rotational motion of the wafer chuck via mechanical linkage interconnecting the wafer chuck and the wafer chuck actuator system. The system further includes a radiation barrier arranged between the first chamber and the second chamber and through which the mechanical linkage extends, the radiation barrier being configured to provide a thermal gradient between the cryogenic temperature of the first chamber and the non-cryogenic temperature of the second chamber.

20 Claims, 4 Drawing Sheets

(58) Field of Classification Search
CPC ......... H01L 21/67178; H01L 21/67098; H01L 21/68707; H01L 21/67207; H01L 21/324; H01L 21/67017; H01L 23/427; H01L 23/46; H01L 21/76864; H01L 21/67766; H01L 21/68714; H01L 23/467; H01L 23/473; H01L 22/00; F28D 1/0213; F28D 15/00; F28D 15/02; F28D 15/025; H05B 2203/035; H05B 3/06; G01R 31/2874; G01R 31/2877; G01R 31/2862; G01R 31/2875; G01R 1/0458; G01R 1/0466; G01R 31/2867; G01R 31/2865; G01R 1/06705; G01R 31/28; G01R 1/0491; G01R 31/2879; G01R 31/2889
See application file for complete search history.

(56) References Cited

U.S. PATENT DOCUMENTS

| | | | |
|---|---|---|---|
| 8,692,567 B2* | 4/2014 | Teich | G01R 31/2874 |
| | | | 324/750.03 |
| 9,831,111 B2* | 11/2017 | Busche | H01L 21/6833 |
| 10,079,165 B2* | 9/2018 | Parkhe | H01L 21/67248 |
| 2020/0348357 A1* | 11/2020 | Junes | G01R 31/2887 |
| 2023/0003788 A1* | 1/2023 | Sage | G01R 1/07342 |

* cited by examiner

PLANAR RING RADIATION BARRIER FOR CRYOGENIC WAFER TEST SYSTEM

TECHNICAL FIELD

This disclosure relates generally to classical and superconducting computing systems, and more specifically to a radiation barrier for a cryogenic wafer test system.

BACKGROUND

Fabrication of integrated circuits (ICs) fundamentally requires testing to determine if the electronic circuits operate as intended. Testing is typically performed at the die level on a given wafer device-under-test (DUT), prior to the many die on the wafer being cut and mounted in respective packages to form the associated "chips". Test systems are typically operated at an environment that simulates typical operation of the circuit to be tested on the respective wafer DUT. Thus, typical semiconductor-based ICs are tested at a non-cryogenic temperature (e.g., "room-temperature") to determine efficacy of the circuit. Similarly, typical superconducting circuits are tested at cryogenic temperatures. Such testing of superconducting circuits at cryogenic temperatures can be both expensive and labor-intensive. For example, for a typical superconducting die test, the wafer DUT is diced into individual chips, placed into special fixtures, and dipped into a liquid helium Dewar, which can be time consuming and helium intensive, and thus not scalable for high volume throughput.

SUMMARY

One example includes a cryogenic wafer test system. The system includes a first chamber that is cooled to a cryogenic temperature and a wafer chuck confined within the first chamber. The wafer chuck can be configured to accommodate a wafer device-under-test (DUT) comprising a plurality of superconducting die. The system also includes a second chamber that is held at a non-cryogenic temperature and which comprises a wafer chuck actuator system configured to provide at least one of translational and rotational motion of the wafer chuck via mechanical linkage interconnecting the wafer chuck and the wafer chuck actuator system. The system further includes a radiation barrier arranged between the first chamber and the second chamber and through which the mechanical linkage extends, the radiation barrier being configured to provide a thermal gradient between the cryogenic temperature of the first chamber and the non-cryogenic temperature of the second chamber.

Another example includes a cryogenic wafer test system. The system includes a first chamber that is cooled to a cryogenic temperature and a second chamber that is held at a non-cryogenic temperature. The system also includes a radiation barrier arranged between the first chamber and the second chamber and comprising a plurality of overlapping planar rings of incrementally increasing size between a first ring and a last ring of the overlapping planar rings. The radiation barrier can be configured to provide a thermal gradient between the cryogenic temperature of the first chamber and the non-cryogenic temperature of the second chamber. The system further includes a mechanical linkage extending through the radiation barrier, such that at least one of the overlapping planar rings of the radiation barrier is configured to slide along a next contiguous one of the overlapping planar rings in response to lateral motion of the mechanical linkage along a plane that is parallel with each of the overlapping planar rings of the radiation barrier.

Another example includes a cryogenic wafer test system. The system includes a first chamber that is cooled to a cryogenic temperature and a wafer chuck confined within the first chamber. The wafer chuck can be configured to accommodate a wafer device-under-test (DUT) comprising a plurality of superconducting die. The system also includes a second chamber that is held at a non-cryogenic temperature and which comprises a wafer chuck actuator system configured to provide at least one of translational and rotational motion of the wafer chuck via mechanical linkage interconnecting the wafer chuck and the wafer chuck actuator system. The system further includes a radiation barrier arranged between the first chamber and the second chamber and through which the mechanical linkage extends and being configured to provide a thermal gradient between the cryogenic temperature of the first chamber and the non-cryogenic temperature of the second chamber. The radiation barrier includes a plurality of overlapping planar rings from a thermally conductive material, and arranged in an incrementally increasing size between a first ring and a last ring of the overlapping planar rings, such that at least one of the overlapping planar rings of the radiation barrier is configured to slide along a next contiguous one of the overlapping planar rings in response to lateral motion of the mechanical linkage along a plane that is parallel with each of the overlapping planar rings of the radiation barrier.

DETAILED DESCRIPTION

Figure 1:
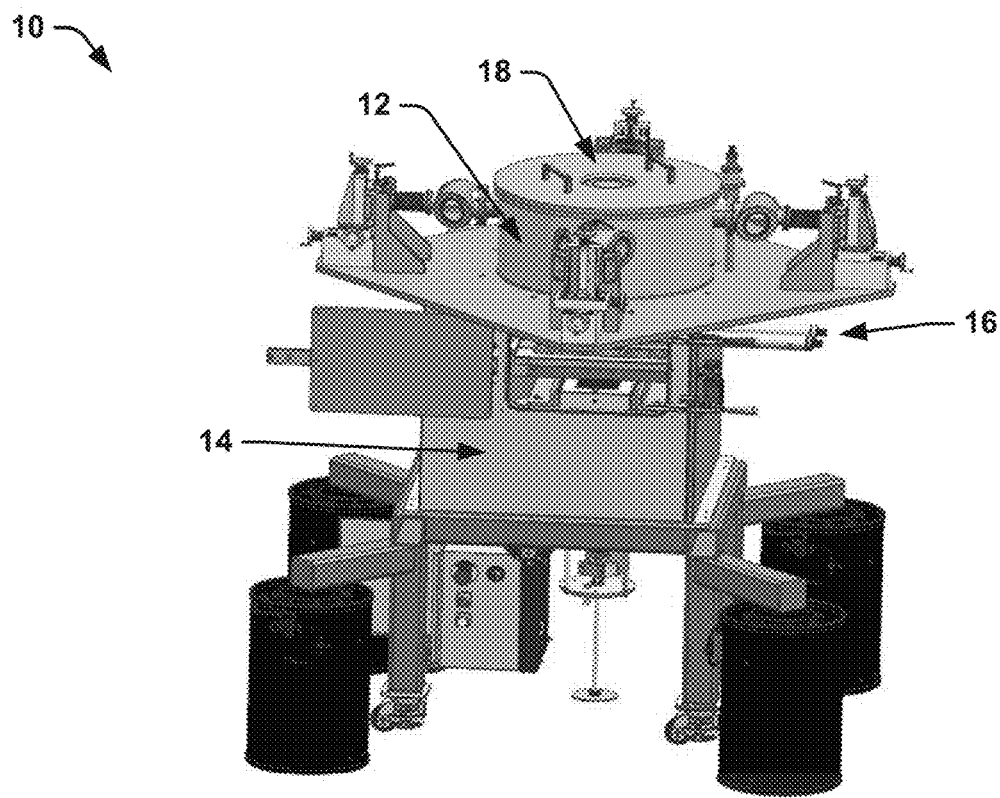
FIG. 1 illustrates an example of a cryogenic wafer test system.

This disclosure relates generally to classical and superconducting computing systems, and more specifically to a radiation barrier break for a cryogenic wafer test system. The cryogenic wafer test system includes a first chamber that is cooled to a cryogenic temperature in a vacuum. The first chamber includes a wafer chuck configured to accommodate a wafer device-under-test (DUT) comprising a plurality of superconducting die that can undergo testing via at least one wafer prober arranged in the first chamber. The cryogenic wafer test system also includes a second chamber, such as separated from the first chamber by a radiation barrier. The second chamber can likewise be evacuated, and can be held at a non-cryogenic temperature. The second chamber includes a wafer chuck actuator system configured to provide at least one of translational and rotational motion of the wafer chuck to facilitate alignment and contact of a plurality of electrical contacts of the superconducting die to the respective plurality of electrical probe contacts of the at least one wafer prober.

As described herein, the terms "first chamber" and "second chamber" can refer to two separate portions of a same chamber (e.g., "upper chamber portion" and "lower chamber portion", respectively) that are separated by the radiation barrier, as described in greater detail herein. As also described herein, the term "cryogenic" describes a temperature that is equal to or less than approximately 10 Kelvin, and the term "non-cryogenic" describes a temperature that is greater than the cryogenic temperature. For example, the ambient temperature of the first chamber can be equal to or less than approximately 10 Kelvin, while components within the first chamber (e.g., the wafer chuck) can have a temperature of equal to or less than approximately 5 Kelvin.

The radiation barrier can be arranged as a plurality of overlapping planar rings. For example, the overlapping planar rings can each be formed from and/or coated with a thermally conductive material (e.g., copper and/or gold), and can be arranged in an incrementally increasing size between a first ring and a last ring of the overlapping planar rings. For example, the first ring can be the smallest ring and can be coupled to the mechanical linkage, such that each next contiguous ring has a larger inner diameter (ID) and a larger outer diameter (OD), with the last ring having the largest ID and the largest OD. Therefore, in response to lateral motion of the mechanical linkage along a plane that is parallel with each of the overlapping planar rings, the overlapping planar rings can slide along a next contiguous one of the overlapping planar rings. Therefore, given the incrementally increasing ID and OD of the overlapping planar rings, at an extreme lateral position of the mechanical linkage, the overlapping planar rings provide no gaps through which radiation can pass in a direct line from the second chamber to the first chamber, and therefore occludes radiation from being able to pass through the radiation barrier from the second chamber to the first chamber. Likewise, upon returning to a neutral position (e.g., from an extreme lateral position), the overlapping planar rings provide no gaps through the radiation barrier between the first and second chambers. Accordingly, the radiation barrier can maintain a sufficient thermal gradient to maintain the cryogenic temperature of the first chamber despite the non-cryogenic temperature of the second chamber, and can facilitate the translational motion of the mechanical linkage through the radiation barrier.

FIG. 1 illustrates an example of a cryogenic wafer test system 10. The cryogenic wafer test system 10 can be configured substantially the same as the cryogenic wafer test system described in, which is incorporated in its entirety herein by reference. The cryogenic wafer test system 10 can be configured to perform testing of each of a plurality of superconducting die on a wafer DUT. For example, the wafer DUT can have a minimum diameter of approximately fifteen centimeters, and can include several hundred separate die (e.g., with each die being sized at approximately five mm$^2$) to be tested. In the example of FIG. 1, the cryogenic wafer test system 10 includes a first chamber 12 and a second chamber 14, with the second chamber 14 being located beneath the first chamber 12. For example, the first and second chambers 12 and 14 can be separated by a radiation barrier that is configured to provide a thermal gradient between the first and second chambers 12 and 14. Therefore, the first chamber 12 can be held to a cryogenic temperature to test the superconducting die and the second chamber 14 can be held to a non-cryogenic temperature. For example, the first chamber 12 can be coupled to liquid (e.g., helium) coolant lines 16 to bring the temperature of the first chamber 12 down to the cryogenic temperature (e.g., approximately 5 K or lower). For example, the liquid coolant lines 16 can be coupled to a plurality of heat exchangers in the first chamber 12, such as statically coupled to a surface (e.g., bottom surface) of the first chamber 12 and flexibly coupled to a wafer chuck on which the superconducting die is tested. As an example, the first and second chambers 12 and 14 can both be at a same pressure (e.g., evacuated), and the radiation barrier can facilitate mechanical interface between the first and second chambers 12 and 14, as described in greater detail herein.

Figure 2:
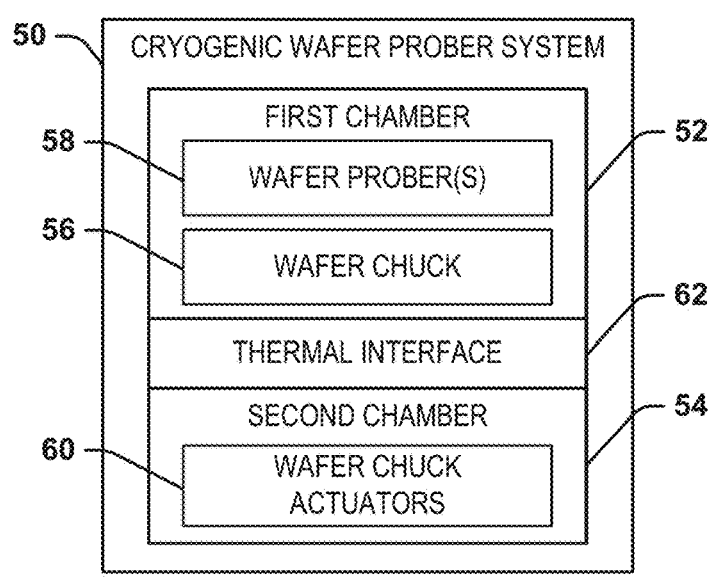
FIG. 2 illustrates an example diagram of a cryogenic wafer test system.

FIG. 2 illustrates an example diagram of a cryogenic wafer test system 50. The cryogenic wafer test system 50 can correspond to the cryogenic wafer test system 10 in the example of FIG. 1. Therefore, reference is to be made to the example of FIG. 1 in the following description of the example of FIG. 2.

The cryogenic wafer test system 50 includes a first chamber 52 and a second chamber 54 that can correspond, respectively, to the first and second chambers 12 and 14 in the example of FIG. 1. As an example, the first and second chambers 52 and 54 can both be at a same pressure (e.g., evacuated), and the first chamber 52 is cooled to a cryogenic temperature. The first chamber 52 includes a wafer chuck 56 configured to accommodate a wafer DUT comprising a plurality of superconducting die to be tested. The cryogenic wafer test system 50 also includes at least one wafer prober 58 arranged in the first chamber 52. The wafer prober(s) 58 includes electrical probe contacts that are implemented to provide physical contact to electrical contacts of a superconducting die of the plurality of superconducting die to implement a test of the superconducting die.

The second chamber 54 includes a wafer chuck actuator system 60 configured to provide at least one of translational and rotational motion of the wafer chuck 56. Therefore, the wafer chuck 56 can be manipulated to facilitate alignment and contact of the plurality of electrical contacts of the superconducting die to the respective plurality of electrical probe contacts of the wafer prober(s) 58. The translational motion can include motion of the wafer chuck 56 along three orthogonal axes, and the rotational motion can provide rotation of the wafer chuck 56 about an axis perpendicular to a planar surface of the wafer DUT. Therefore, the wafer chuck actuator system 60 is configured to facilitate motion of the wafer DUT to align the electrical contacts of a given one of the superconducting die to the electrical probe contacts of the wafer prober(s) 58. Thus, the wafer chuck actuator system 60 can provide precision contact of the electrical contacts of the respective one of the superconducting die to the electrical probe contacts of the wafer prober(s) 58 to facilitate the test of the respective one of the superconducting die.

Referring back to the example of FIG. 1, the first chamber 12 can include a substantially transparent viewing window 18 that can provide an overhead view to the inside the first chamber 12. Therefore, the viewing window 18 can provide a view of the planar surface of the wafer DUT to facilitate the alignment of the wafer DUT to the wafer prober(s) 58, and thus the electrical contacts of the wafer DUT to the respective electrical prober contacts of the wafer prober(s) 58, via the wafer chuck actuator system 60. As an example, the viewing window can be formed of any of a variety of substantially transparent crystalline materials that can facilitate operation in the first chamber 12 at the cryogenic temperature. As another example, the cryogenic wafer test system 10 can include an electronic vision system (not shown) that can provide approximately real-time imaging of the first chamber 12 through the viewing window 18. Accordingly, the vision system can further facilitate alignment of the electrical contacts on the surface of the superconducting die to the respective electrical probe contacts on the wafer prober(s) 58 to allow for real-time adjustments of the position of the wafer DUT via the wafer chuck actuator system 60 for aligning the electrical contacts to the electrical probe contacts.

Referring back to the example of FIG. 2, the second chamber 54 is demonstrated as separated from the first chamber 52 by a radiation barrier 62. As described herein, the radiation barrier 62 is configured to provide a thermal gradient between the first and second chambers 52 and 54 by occluding direct line radiation from propagating from the second chamber 54 to the first chamber 52. For example, because both the first and second chambers 52 and 54 can be evacuated, there is substantially no convection heat transfer that can occur from the second chamber 54 to the first chamber 52. Thus, only radiation can provide heat transfer from the second chamber 54 to the first chamber 52. As a result, by occluding direct line radiation from propagating from the second chamber 54 to the first chamber 52, the radiation barrier 62 can substantially mitigate heat transfer from the second chamber 54 to the first chamber 52. Therefore, the first chamber 52 can be held to a cryogenic temperature (e.g., approximately 5 K or lower) to test the superconducting die and the second chamber 54 can be held to a non-cryogenic temperature. As described in greater detail herein, the radiation barrier 62 can facilitate mechanical interface between the first and second chambers 52 and 54. Therefore, the wafer chuck actuator system 60 can be mechanically coupled to the wafer chuck 56 through the radiation barrier 62 to facilitate the translational and/or rotational motion of the wafer chuck 56 via the wafer chuck actuator system 60 through the radiation barrier 62.

The arrangement of the cryogenic wafer test system 50 can thus facilitate a more efficient testing environment of superconducting die than typical superconducting test fixtures. For example, by facilitating motion of the wafer chuck 56, and thus the wafer DUT, via the wafer chuck actuator system 60, the cryogenic wafer test system 50 can test multiple superconducting die sequentially in an indexed manner on the wafer DUT, as opposed to testing individually cut superconducting die that have been individually cooled via dipping into a liquid Dewar. As a result, by performing tests iteratively on each of the superconducting die on the wafer DUT, the process of testing each of the superconducting die in an indexed manner can be significantly more efficient by saving time between testing of each individual superconducting die, as well as by saving energy and cooling material (e.g., liquid helium) by operating the first chamber 52 that encapsulates the wafer DUT at the cryogenic temperature. Accordingly, the cryogenic wafer test system 50 provides for much more efficient testing than typical systems that implement die testing, and can provide for testing a large number of die in a superconducting environment in an indexed manner.

Figure 3:
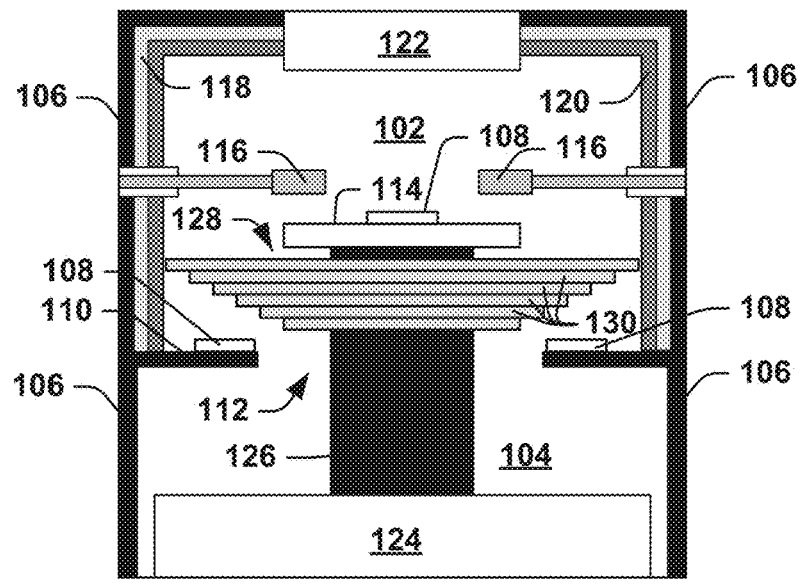
FIG. 3 illustrates another example diagram of a cryogenic wafer test system.

FIG. 3 illustrates another example diagram of a cryogenic wafer test system 100. The cryogenic wafer test system 100 can correspond to the cryogenic wafer test system 10 in the example of FIG. 1. Therefore, reference is to be made to the example of FIG. 1 in the following description of the example of FIG. 3.

The cryogenic wafer test system 100 includes a first chamber 102 and a second chamber 104 that can correspond, respectively, to the first and second chambers 12 and 14 in the example of FIG. 1. The first and second chambers 102 and 104 are demonstrated in the example of FIG. 3 in a cross-sectional view. The first and second chambers 102 and 104 each include a perimeter wall 106 that substantially surround and enclose the respective first and second chambers. In the example of FIG. 3, the first chamber 102 includes heat exchangers 108 that are arranged on a thermally conductive (e.g., aluminum) bottom surface 110 of the first chamber 102. The bottom surface 110 has an aperture 112 that provides an opening between the first and second chambers 102 and 104. The heat exchangers 108 can be configured to receive a cooling fluid (e.g., liquid helium) to cool the first chamber 102 to a cryogenic temperature (e.g., in a vacuum). Additionally, the first chamber includes a wafer chuck 114 configured to accommodate a wafer DUT comprising a plurality of superconducting die to be tested. In the example of FIG. 3, the wafer chuck 114 can include a thermally conductive surface on which another heat exchanger 108 is arranged. Therefore, the heat exchanger 108 can likewise be provided a cooling liquid (e.g., helium), such as via a flexible hose to allow for the cooling liquid to be provided to the heat exchanger 108 as it moves with the wafer chuck 114, to cool the first chamber 102 to the cryogenic temperature. The cryogenic wafer test system 100 also includes at least one wafer prober 116 arranged in the first chamber 102.

In the example of FIG. 3, the first chamber 102 also includes a radiation shield 118 and a magnetic shield 120 that are arranged interior with respect to the perimeter wall 106. The radiation shield 118 can, for example, provide thermal insulation of the first chamber 102 to assist in maintaining the first chamber at the cryogenic temperature. The magnetic shield 120 can provide protection for the wafer DUT on the wafer chuck 114 from external magnetic fields, such as to provide more accurate testing. The first chamber 102 also includes a substantially transparent viewing window 122 that can provide an overhead view to the inside the first chamber 102. Therefore, the viewing window 122 can provide a view of the planar surface of the wafer DUT to facilitate the alignment of the wafer DUT to the wafer prober(s) 116 (e.g., via a vision system), and thus the electrical contacts of the wafer DUT to the respective electrical prober contacts of the wafer prober(s) 116. For example, the viewing window 122 can be formed from a thermally insulating transparent or translucent material, such as a crystalline material (e.g., sapphire), to mitigate ambient heating of the first chamber 102. As another example, a thermal shutter (not shown) can cover the viewing window 122 to help stabilize the cryogenic temperature of the first chamber 102 when the viewing window 122 is not needed for alignment.

The second chamber 104 includes a wafer chuck actuator system 124 configured to provide at least one of translational and rotational motion of the wafer chuck 114 via a mechanical linkage 126. As an example, the mechanical linkage 126 can be configured as a shaft that can extend along an axis and/or rotate about the axis. Therefore, the wafer chuck 114 can be manipulated to facilitate alignment and contact of the plurality of electrical contacts of the superconducting die to the respective plurality of electrical probe contacts of the wafer prober(s) 116. The translational motion can include motion of the wafer chuck 114 along three orthogonal axes, and the rotational motion can provide rotation of the wafer chuck 114 about an axis perpendicular to a planar surface of the wafer DUT. Therefore, the wafer chuck actuator system 124 is configured to facilitate motion of the wafer DUT to align the electrical contacts of a given one of the superconducting die to the electrical probe contacts of the wafer prober(s) 116. Thus, the wafer chuck actuator system 124 can provide precision contact of the electrical contacts of the respective one of the superconducting die to the electrical probe contacts of the wafer prober(s) 116 to facilitate the test of the respective one of the superconducting die.

In the example of FIG. 3, the cryogenic wafer test system 100 also includes a radiation barrier 128. The radiation barrier 128 is coupled to the mechanical linkage 126 and is arranged to obstruct radiation that could propagate in a straight line from the second chamber 104, through the aperture 112, and into the first chamber 102. Therefore, the radiation barrier 128 is configured to provide a thermal gradient between the first and second chambers 102 and 104. Therefore, the first chamber 102 can be held to a cryogenic temperature (e.g., approximately 5 K or lower) to test the superconducting die and the second chamber 104 can be held to a non-cryogenic temperature. As described herein, the radiation barrier 128 can facilitate mechanical interface between the first and second chambers 102 and 104 while maintaining the thermal gradient between the first and second chambers 102 and 104. Therefore, the wafer chuck actuator system 124 can be mechanically coupled to the wafer chuck 114 through the radiation barrier 128 to facilitate the translational and/or rotational motion of the wafer chuck 114 via the wafer chuck actuator system 124 through the radiation barrier 128.

In the example of FIG. 3, the radiation barrier 128 is demonstrated as a plurality of overlapping planar rings 130 through which the mechanical linkage 126 extends from the wafer chuck actuator system 124 to the wafer chuck 114. For example, the overlapping planar rings 130 can each be formed from and/or coated with a thermally conductive material (e.g., copper and/or gold), and can be arranged in an incrementally increasing size between a first ring (e.g., on the bottom) and a last ring (e.g., on the top) of the overlapping planar rings 130. As an example, the overlapping planar rings 130 can be formed from copper and coated with gold. As another example, the overlapping planar rings 130 can be formed from a thermally conductive metal. As an example, the first ring (e.g., on the bottom) can have a thermally conductive and flexible coupling (e.g., a metallic braid or thermal strap) to the wafer chuck 114, such that the heat exchanger 108 on the wafer chuck 114 can provide thermal cooling of the first ring, and thus the radiation barrier 128. Similarly, the last ring (e.g., on the top) can have a thermally conductive and flexible coupling (e.g., a metallic braid or thermal strap) to the bottom surface 110 of the first chamber 102, such that the heat exchanger 108 on the bottom surface 110 can provide thermal cooling of the last ring, and thus the radiation barrier 128.

For example, the first ring can be the smallest ring and can be coupled to the mechanical linkage 126, such that each next contiguous ring has a larger inner diameter (ID) and a larger outer diameter (OD), with the last ring having the largest ID and the largest OD. As an example, the mechanical linkage 126 can include a flange upon which the first ring can rest via gravity, and therefore without mechanical coupling. Thus, the remaining overlapping planar rings 130 can each rest upon the respective ring below by gravity. The last ring, and thus the largest ring, can have a range of motion that is limited by fixed mechanical limits in the first chamber 102, such as posts that extend from the bottom surface 110 or the inner surface of the perimeter wall 106 (e.g., the magnetic barrier 120). Therefore, in response to lateral motion of the mechanical linkage 126 along a plane that is parallel with each of the overlapping planar rings 130, one or more of the overlapping planar rings 130 can slide along a next contiguous one of the overlapping planar rings 130. Additionally, the radiation barrier 128 can move up and down as the wafer chuck 114 moves up and down via the mechanical linkage 126.

Therefore, given the incrementally increasing ID and OD of the overlapping planar rings, at an extreme lateral position of the mechanical linkage 126, the overlapping planar rings 130 provide no gaps through the radiation barrier 128 between the first and second chambers 102 and 104 through which radiation can propagate in a straight line from the second chamber 104 to the first chamber 102. In other words, the radiation barrier 128 provides a mechanical range of lateral motion of the mechanical linkage 126 while preventing any gaps between the first and second chambers 102 and 104 through which radiation can pass through the radiation barrier 128 in a straight line. Likewise, when returning to a neutral position (e.g., from the extreme lateral position), the overlapping planar rings 130 provide no gaps through the radiation barrier 128 between the first and second chambers 102 and 104. Accordingly, the radiation barrier 128 can maintain a sufficient thermal gradient to maintain the cryogenic temperature of the first chamber 102 despite the non-cryogenic temperature of the second chamber 104, and can facilitate the translational motion of the mechanical linkage 126 through the radiation barrier 128. Additionally, the interior of the first chamber 102 can be coated with a radiation damping material to absorb radiation that may bounce from the radiation barrier 128 to within the first chamber 102.

Figure 4:
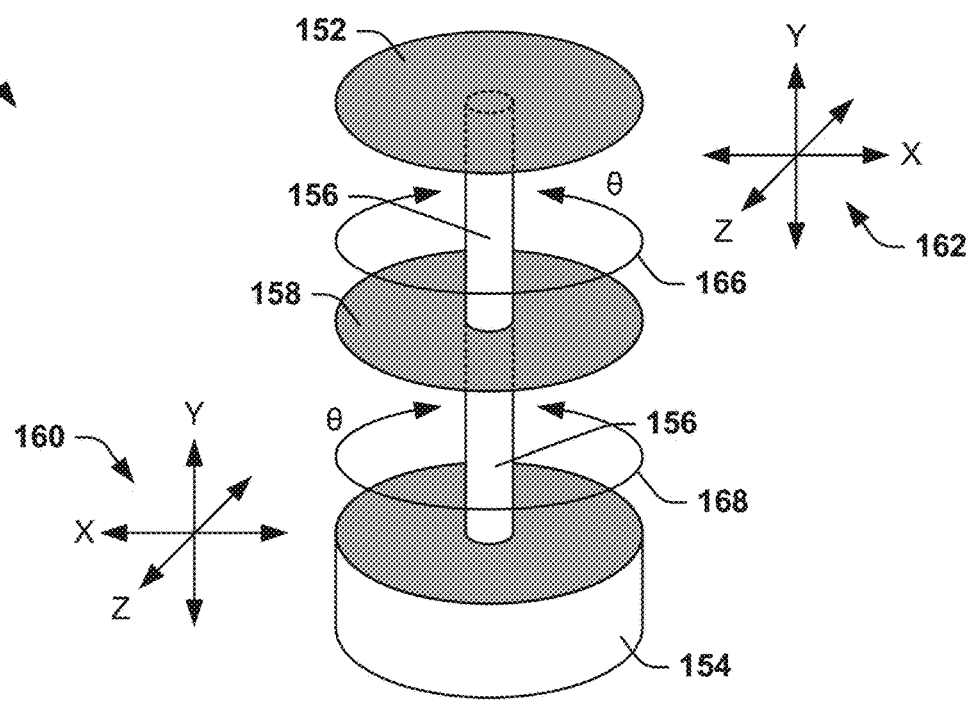
FIG. 4 illustrates an example diagram of motion of the wafer chuck.

FIG. 4 illustrates an example diagram 150 of motion of a wafer chuck. The diagram 150 can correspond to demonstration of motion of a wafer chuck 152 via a wafer chuck actuator system 154. As an example, the wafer chuck 152 can correspond to the wafer chuck 56 and the wafer chuck 114 in the respective examples of FIGS. 2 and 3, and the wafer chuck actuator system 154 can correspond to the wafer chuck actuator system 60 or the wafer chuck actuator system 124 in the respective examples of FIGS. 2 and 3. Therefore, reference is to be made to the example of FIGS. 2 and 3 in the following description of the example of FIG. 4.

In the example of FIG. 4, the wafer chuck 152 and the wafer chuck actuator system 154 are demonstrated as coupled via a mechanical linkage 156 that extends from the wafer chuck actuator system 154 through a radiation barrier 158 to the wafer chuck 152. As an example, the mechanical linkage 156 can correspond to any of a variety of mechanical and physical connections between the wafer chuck 152 and the wafer actuator system 154. For example, the mechanical linkage 156 can be configured as a cylindrical or prismatic shaft arranged within a sleeve portion that is coupled to the radiation barrier 158, with the shaft extending between the wafer chuck actuator system 154 and the wafer chuck 152 to provide motion of the wafer chuck 152 in response to motion of or electrical commands from the wafer chuck actuator system 154. As another example, the mechanical linkage 156 can include other or additional mechanical components, such as including gears, motors, servos, or a variety of other mechanical connection means.

In the example of FIG. 4, the wafer chuck actuator system 154 can perform translational motion or provide control commands to the wafer chuck 152 for translational motion, demonstrated at 160 as motion along three orthogonal axes (e.g., X, Y, and Z-axes). In response to the translational motion of or the control commands provided from the wafer chuck actuator system 154, the wafer chuck 152 can perform corresponding translational motion along the respective three orthogonal axes (e.g., the corresponding X, Y, and Z-axes), demonstrated at 162, via the mechanical linkage 156. Similarly, the wafer chuck actuator system 154 can perform rotational motion or provide control commands to the wafer chuck 152 for rotational motion, demonstrated as the circular arrow at 164 (e.g., about an angle θ). In response to the rotational motion of or the control commands provided from the wafer chuck actuator system 154, the wafer chuck 152 can perform corresponding rotational motion about an axis perpendicular to a surface of the wafer chuck 152 (e.g., about an axis of the mechanical linkage 156), demonstrated at 166 (e.g., about the corresponding angle θ), via the mechanical linkage 156.

As a result, the wafer chuck actuator system 154 can be implemented by a user of the cryogenic wafer test system 50 to provide translational and/or rotational motion of the wafer chuck 152, and thus the wafer DUT that is affixed to the wafer chuck 152 during testing of the superconducting die on the wafer DUT. Furthermore, based on the overlapping ring arrangement of the radiation barrier 158, the wafer chuck actuator system 154 can move the wafer chuck 152 in a lateral motion (e.g., planar motion in the XZ-plane) without opening a gap between the first and second chambers 102 and 104 through which radiation can pass in a straight line. Therefore, the radiation barrier 158 can maintain the thermal gradient between the first and second chambers 102 and 104, such as to maintain a cryogenic temperature in the first chamber 102 while facilitating the motion of the wafer chuck 152 in the first chamber 102 based on the controls provided by the wafer chuck actuator system 154 in the second chamber 104. In other words, the radiation barrier 158 can allow mechanical communication between the cryogenic first chamber 102 and the non-cryogenic second chamber 104 via the mechanical linkage 156 that extends from the first chamber 102 to the second chamber 104. As a result, the radiation barrier 158 can facilitate the efficient wafer testing of the cryogenic wafer test system 50 to allow for testing of a large number of die on a wafer in an indexed manner, as described above.

Figure 5:
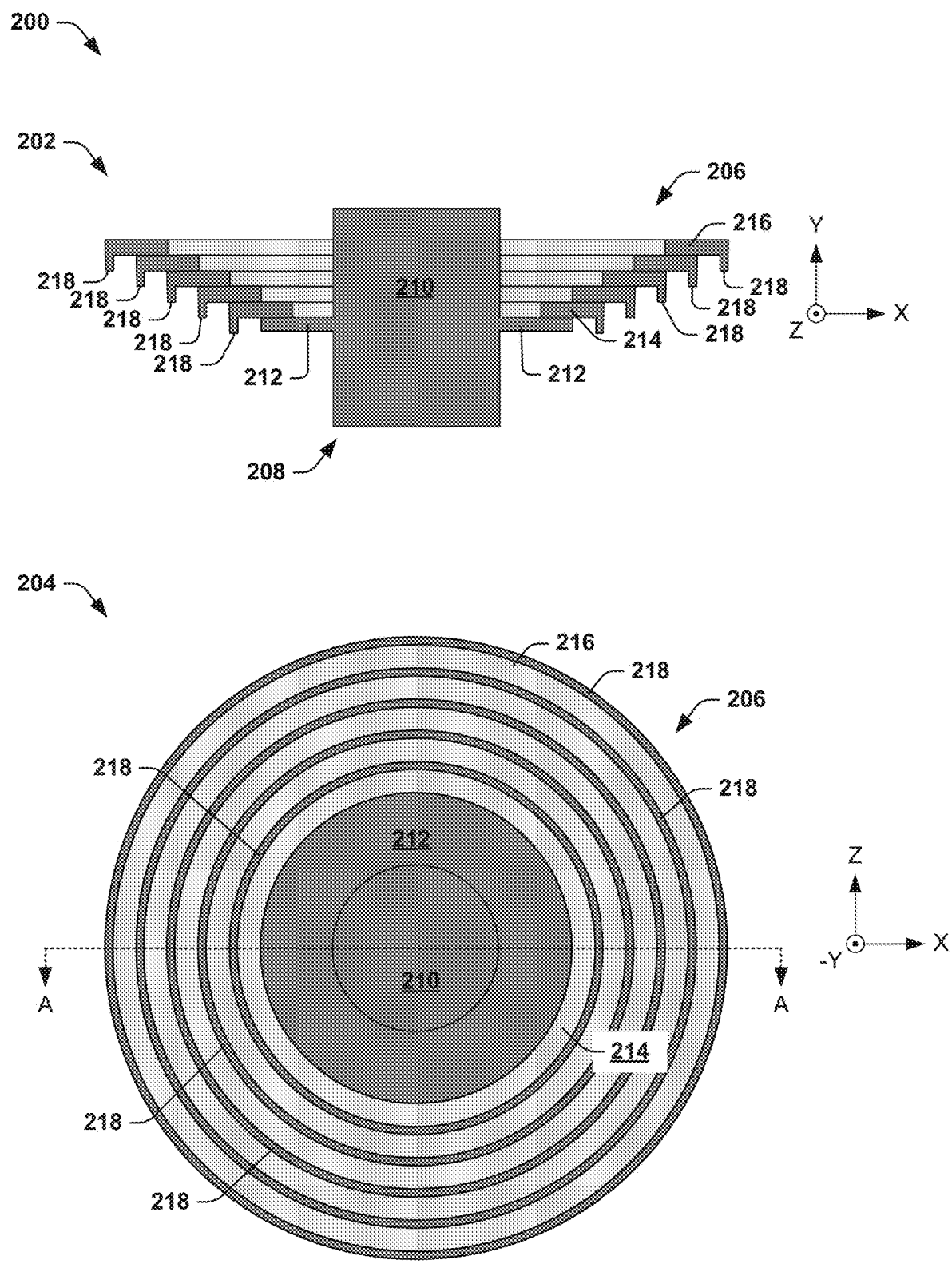
FIG. 5 illustrates an example diagram of a radiation barrier.

FIG. 5 illustrates an example diagram 200 of a radiation barrier. The diagram 200 demonstrates a first view 202 and a second view 204 of the radiation barrier 206. The radiation barrier 206 can correspond to the radiation barrier 62, 128, or 158 in the respective example of FIGS. 2-4. Therefore, reference is to be made to the examples of FIGS. 2-4 in the following description of the example of FIG. 5.

The first view 202 is demonstrated as a cross-sectional view of a portion of the mechanical linkage and the radiation barrier 206, taken along "A" in the second view 204 that is demonstrated as an underneath view of the radiation barrier 206. The first and second view 202 and 204 also each include the mechanical linkage 208, demonstrated as including a shaft 210 that extends between the wafer chuck (e.g., the wafer chuck 56, 108, 152) and the wafer actuator system (e.g., the wafer actuator system 60, 124, 154), and is therefore configured to slide along and rotate about the Y-axis. The mechanical linkage 208 can also move in a planar motion along the XZ-plane. In the example of FIG. 5, the mechanical linkage 208 includes a flange 212, such as integrally formed with the shaft portion of the mechanical linkage 208.

The radiation barrier 206 is demonstrated as a plurality of overlapping planar rings, such that the overlapping planar rings are not mechanically coupled to each other in any way other than through contact and gravity. The rings are demonstrated with a darker shading to correspond to the cross-section of the material and a lighter shading to correspond to the hollow interior of the ring (inside the ID of the respective rings). The overlapping planar rings can each be formed from and/or coated with a thermally conductive material (e.g., copper and/or gold), and are arranged in an incrementally increasing size between a first ring 214 and a last ring 216 of the overlapping planar rings. In the example of FIG. 5, the first ring 214 is the smallest ring and rests upon the flange 212, such that each next contiguous ring has a larger ID and a larger OD, with the last ring 216 having the largest ID and the largest OD. Each of the rings also includes a lip 218 arranged at approximately the OD and which extends in the −Y direction. As described in greater detail herein, the lip 218 is arranged such that the ring below the respective one of the rings contacts the lip 218 to facilitate motion in the XZ-plane of the respective one of the rings. The second view 204 thus demonstrates the concentricity of the rings of the radiation barrier 206 in a neutral position, and thus with the mechanical linkage 208 and each of the rings of the radiation barrier 206 being axially aligned.

Figure 6:
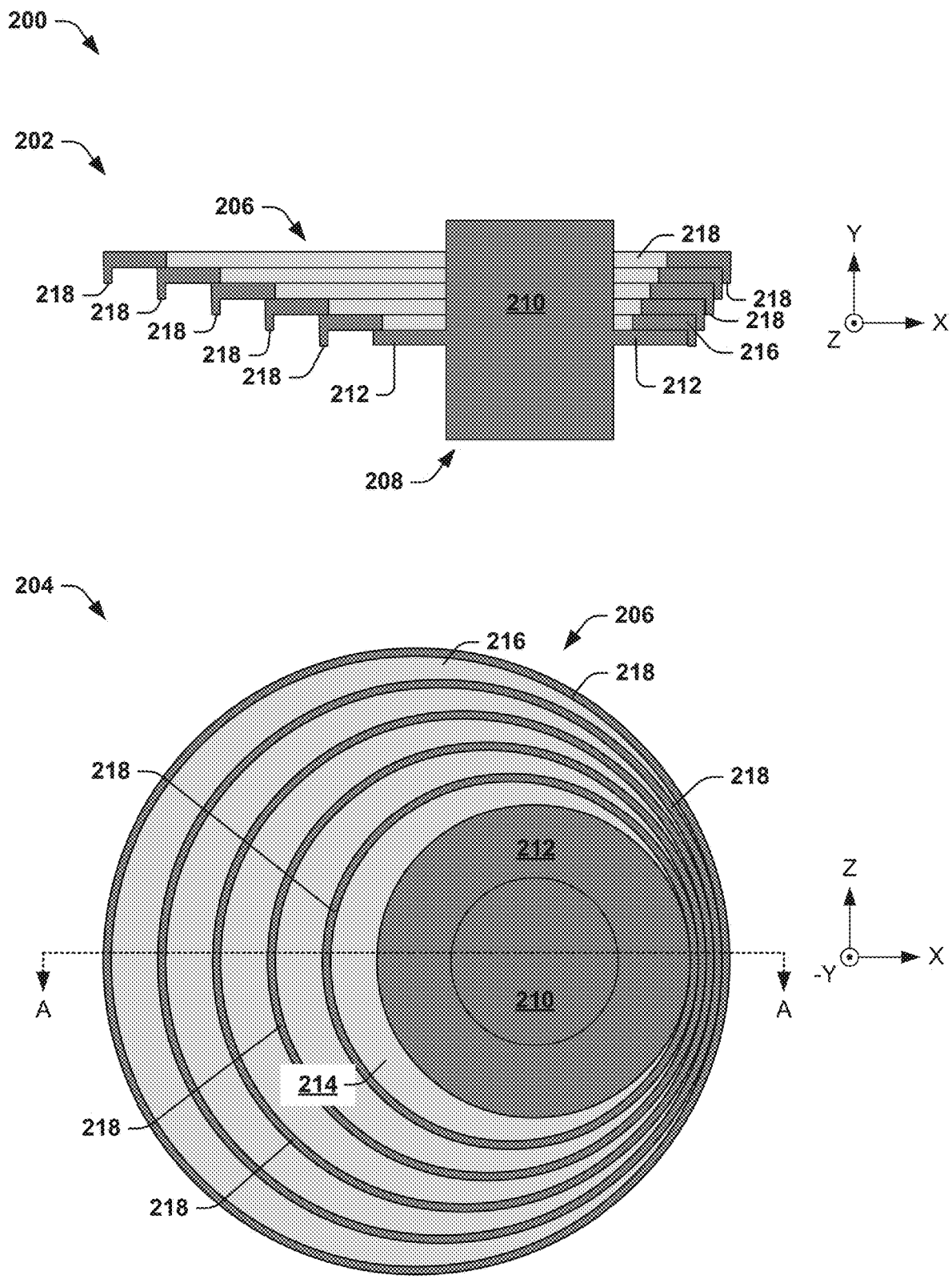
FIG. 6 illustrates another example diagram of a radiation barrier.

FIG. 6 illustrates another example diagram 250 of a radiation barrier. The diagram 200 demonstrates a first view 252 and a second view 254 of the radiation barrier 206. The diagram 250 demonstrates the result of lateral motion of the mechanical linkage 208 to an extreme position in the XZ-plane (along the X-axis in the example of FIG. 6). Therefore, reference is to be made to the examples of FIG. 5 in the following description of the example of FIG. 5.

In the example of FIG. 6, in response to lateral motion of the mechanical linkage 208 along the X-axis, the OD of the flange 212 can contact the lip 218 of the first ring 214, which causes the first ring 214 to being moving along the X-axis. The OD of the first ring 214 can then contact the lip 218 of the next contiguous ring (e.g., above the first ring 214), which can cause the next contiguous ring to begin moving along the X-axis. Such a sequence can continue until the OD of the ring below the last ring 216 contacts the lip 218 of the last ring 216, which thus corresponds to a bound of the motion along the X-axis. Based on the relative diameter of the ID and OD of the contiguous rings relative to each other, the ID of a given ring overlaps the OD of the next contiguous ring (e.g., below) along the axis opposite the direction of the motion. As described above, the last ring 216 can have a motion limit that is based on a fixed mechanical obstacle, such that the other rings can slide beneath the last ring 216 as the mechanical linkage 208 moves after the last ring 216 contacts the fixed mechanical obstacle. As a result, there is no gap between the overlapping planar rings through the radiation barrier 206, and therefore no gap between the first and second chambers through which radiation can pass from the second chamber to the first chamber in a straight line. Accordingly, the overlapping planar rings can slide along each other as the mechanical linkage 208 moves along the XZ-plane to maintain no gaps in the radiation barrier 206 between the first and second chambers to maintain the thermal gradient between the first and second chambers.

The sequence of motion of the rings is not limited to as described herein. For example, some of the rings can move along with the rings below them, without contact of the OD with the lip 218 of the next contiguous ring, based on friction. Thus, the lips 218 can merely provide a boundary of motion while maintaining no gaps between two contiguous rings. As another example, the arrangement of the rings is not limited to as demonstrated in the example of FIGS. 5 and 6. For example, the rings can be inverted relative to that demonstrated in the examples of FIGS. 5 and 6, such that the smallest first ring 214 can be on the top of the radiation barrier 206 and the largest last ring 216 can be on the bottom of the radiation barrier 206, with all of the rings being below the flange 212. As another example, the rings can be flexibly coupled to the mechanical linkage 208 or to a fixed portion of the first or second chamber to provide elasticity of the motion of the rings of the radiation barrier 206. Thus, the rings of the radiation barrier 206 can flexibly move back to the neutral position demonstrated in the second view 204 of the example of FIG. 5 in response to the motion of the mechanical linkage 208 back to the neutral position to maintain the coaxial concentricity of the rings in the neutral position. Accordingly, the radiation barrier 206 can be arranged in a variety of ways.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A cryogenic wafer test system comprising:
   a first chamber that is cooled to a cryogenic temperature;
   a wafer chuck confined within the first chamber, the wafer chuck being configured to accommodate a wafer device-under-test (DUT) comprising a plurality of superconducting die;
   a second chamber that is held at a non-cryogenic temperature and which comprises a wafer chuck actuator system configured to provide at least one of translational and rotational motion of the wafer chuck via mechanical linkage interconnecting the wafer chuck and the wafer chuck actuator system; and
   a radiation barrier arranged between the first chamber and the second chamber and through which the mechanical linkage extends, the radiation barrier being configured to provide a thermal gradient between the cryogenic temperature of the first chamber and the non-cryogenic temperature of the second chamber, the radiation barrier comprising a plurality of overlapping planar rings of incrementally increasing size between a first ring and a last ring of the overlapping planar rings.

2. The system of claim 1, wherein at least one of the overlapping planar rings is configured to slide along a next contiguous one of the overlapping planar rings in response to lateral motion of the mechanical linkage along a plane that is parallel with each of the overlapping planar rings of the radiation barrier.

3. The system of claim 2, wherein each of the overlapping planar rings is at least one of formed from and coated with a thermally conductive material.

4. The system of claim 3, wherein at least one of the overlapping planar rings is flexibly coupled via a thermally conductive strap to a thermally conductive surface in the first chamber, wherein the cryogenic wafer test system further comprises at least one heat exchanger coupled to the thermally conductive surface, the heat exchanger being configured to cool the first chamber to the cryogenic temperature via a cooling liquid.

5. The system of claim 2, wherein each of the plurality of overlapping planar rings comprises incrementally increasing inner and outer diameters between the first ring and the last ring of the plurality of overlapping planar rings.

6. The system of claim 5, wherein the inner and outer diameters are dimensioned such that the inner diameter of a given one of the overlapping planar rings radially extends farther than the inner diameter of the next contiguous one of the overlapping planar rings at an extreme lateral position of the mechanical linkage to provide no gaps through the radiation barrier between the first and second chambers through which radiation can pass from the second chamber to the first chamber.

7. The system of claim 5, wherein the mechanical linkage comprises a flange having a surface upon which the first ring is in non-mechanical contact, such that the first ring slides along the surface of the flange, and wherein the last ring is in contact with one of the first and second chambers.

8. The system of claim 2, wherein each of the overlapping planar rings comprises a lip on a first surface of the respective ring that extends axially from the first surface of the respective ring.

9. The system of claim 8, wherein each of the overlapping planar rings is configured to contact the lip associated with a next contiguous one of the overlapping planar rings via a surface associated with an outer diameter of the respective one of the overlapping planar rings to facilitate motion of the next contiguous one of the overlapping planar rings in response to the lateral motion of the mechanical linkage.

10. The system of claim 1, wherein the first chamber comprises:
    a perimeter wall;
    a radiation shield arranged with respect to an interior of the perimeter wall; and
    a magnetic shield arranged with respect to the interior of the perimeter wall, wherein the wafer chuck is confined within the radiation shield and the magnetic shield.

11. A cryogenic wafer test system comprising:
    a first chamber that is cooled to a cryogenic temperature;
    a second chamber that is held at a non-cryogenic temperature;
    a radiation barrier arranged between the first chamber and the second chamber and comprising a plurality of overlapping planar rings of incrementally increasing size between a first ring and a last ring of the overlapping planar rings, the radiation barrier being configured to provide a thermal gradient between the cryogenic temperature of the first chamber and the non-cryogenic temperature of the second chamber;
    a mechanical linkage extending through the radiation barrier, such that at least one of the overlapping planar rings of the radiation barrier is configured to slide along a next contiguous one of the overlapping planar rings in response to lateral motion of the mechanical linkage along a plane that is parallel with each of the overlapping planar rings of the radiation barrier.

12. The system of claim 11, wherein each of the overlapping planar rings is at least one of formed from and coated with a thermally conductive material.

13. The system of claim 11, wherein each of the plurality of overlapping planar rings comprises incrementally increasing inner and outer diameters between the first ring and the last ring of the plurality of overlapping planar rings.

14. The system of claim 13, wherein the inner and outer diameters are dimensioned such that the inner diameter of a given one of the overlapping planar rings radially extends farther than the inner diameter of the next contiguous one of the overlapping planar rings at an extreme lateral position of the mechanical linkage to provide no gaps through the radiation barrier between the first and second chambers through which radiation can pass from the second chamber to the first chamber.

15. The system of claim 11, wherein each of the overlapping planar rings comprises a lip on a first surface of the respective ring that extends axially from the first surface of the respective ring, wherein each of the overlapping planar rings is configured to contact the lip associated with the next contiguous one of the overlapping planar rings via a surface associated with an outer diameter of the respective one of the overlapping planar rings to facilitate motion of the next contiguous one of the overlapping planar rings in response to the lateral motion of the mechanical linkage.

16. A cryogenic wafer test system comprising:
a first chamber that is cooled to a cryogenic temperature;
a wafer chuck confined within the first chamber, the wafer chuck being configured to accommodate a wafer device-under-test (DUT) comprising a plurality of superconducting die;
a second chamber that is held at a non-cryogenic temperature and which comprises a wafer chuck actuator system configured to provide at least one of translational and rotational motion of the wafer chuck via mechanical linkage interconnecting the wafer chuck and the wafer chuck actuator system; and
a radiation barrier arranged between the first chamber and the second chamber and through which the mechanical linkage extends and being configured to provide a thermal gradient between the cryogenic temperature of the first chamber and the non-cryogenic temperature of the second chamber, the radiation barrier comprising a plurality of overlapping planar rings formed from a thermally conductive material, and arranged in an incrementally increasing size between a first ring and a last ring of the overlapping planar rings, such that at least one of the overlapping planar rings of the radiation barrier is configured to slide along a next contiguous one of the overlapping planar rings in response to lateral motion of the mechanical linkage along a plane that is parallel with each of the overlapping planar rings of the radiation barrier.

17. The system of claim 16, wherein at least one of the overlapping planar rings is flexibly coupled via a thermally conductive strap to a thermally conductive surface in the first chamber, wherein the cryogenic wafer test system further comprises at least one heat exchanger coupled to the thermally conductive surface, the heat exchanger being configured to cool the first chamber to the cryogenic temperature via a cooling liquid.

18. The system of claim 16, wherein each of the plurality of overlapping planar rings comprises incrementally increasing inner and outer diameters between the first ring and the last ring of the plurality of overlapping planar rings.

19. The system of claim 18, wherein the inner and outer diameters are dimensioned such that the inner diameter of a given one of the overlapping planar rings radially extends farther than the inner diameter of the next contiguous one of the overlapping planar rings at an extreme lateral position of the mechanical linkage to provide no gaps through the radiation barrier between the first and second chambers through which radiation can pass from the second chamber to the first chamber.

20. The system of claim 16, wherein each of the overlapping planar rings comprises a lip on a first surface of the respective ring that extends axially from the first surface of the respective ring, wherein each of the overlapping planar rings is configured to contact the lip associated with a next contiguous one of the overlapping planar rings via a surface associated with an outer diameter of the respective one of the overlapping planar rings to facilitate motion of the next contiguous one of the overlapping planar rings in response to the lateral motion of the mechanical linkage.

* * * * *